United States Patent [19]
Fukaya et al.

[11] Patent Number: 5,955,752
[45] Date of Patent: Sep. 21, 1999

[54] SEMICONDUCTOR MODULE HAVING ANTENNA ELEMENT THEREIN

[75] Inventors: Jun Fukaya; Yoshio Aoki, both of Kawasaki; Yasutake Hirachi, Tokyo; Jun-ichi Ishibashi, Tokyo; Toshio Yamamoto, Tokyo, all of Japan

[73] Assignees: Fujitsu Limited, Kawasaki; Olympus Optical Co. Ltd., Tokyo, both of Japan

[21] Appl. No.: 09/040,363

[22] Filed: Mar. 18, 1998

[30] Foreign Application Priority Data

Jun. 13, 1997 [JP] Japan .................................. 9-156949

[51] Int. Cl.⁶ ...................................................... H01L 29/80
[52] U.S. Cl. .......................... 257/275; 257/664; 257/698; 257/778
[58] Field of Search ..................... 257/275, 664, 257/698, 777, 778

[56] References Cited

FOREIGN PATENT DOCUMENTS

A-52-33450   3/1977   Japan .
A-53-69567   6/1978   Japan .
A-63-316905  12/1988  Japan .

Primary Examiner—Valencia Martin-Wallace
Attorney, Agent, or Firm—Armstrong, Westerman, Hattori, McLeland, & Naughton

[57] ABSTRACT

A semiconductor module having a compact antenna element capable of providing desired directivity therein has been disclosed. When an electromagnetic-wave radiation window has the capability of a lens, directivity can be set arbitrarily. For improving directivity, a convergent lens for converging millimeter waves or quasi millimeter waves is employed. For impairing directivity, a divergent lens is employed. In the case of the convergent lens, a direction in which radio waves are radiated or received by the antenna element can be set by deviating the center axis of the lens from the center of the antenna element.

22 Claims, 18 Drawing Sheets

SEMICONDUCTOR MODULE HAVING ANTENNA ELEMENT THEREIN

BACKGROUND OF THE INVENTION

1. Field of the Invention

The present invention relates to a semiconductor module having an antenna element therein. More particularly, this invention is concerned with a semiconductor module in which an antenna element suitable for a frequency band of millimeter waves ranging from 30 gigahertz to 300 gigahertz and a frequency band of quasi millimeter waves which is lower than the frequency band of millimeter waves is incorporated.

2. Description of the Related Art

Transmitters and receivers using millimeter waves (30 GHz to 300 GHz) are needed for radar sensors to be incorporated in a motorcar or for short-distance high-speed communications over LANs or the like. A transmitter for transmitting millimeter waves included in a radar system comprises a semiconductor device (semiconductor circuit) serving as a signal source for generating millimeter waves, a mixer semiconductor device for adding information to millimeter waves, and an antenna for radiating millimeter waves. In a receiver, a millimeter-wave receiving antenna, an amplifier semiconductor device for amplifying received millimeter waves, and a mixer semiconductor device for extracting information are employed.

In the past, a plurality of semiconductor devices each of which is fabricated separately by packing components except an antenna element in a package or housing and then sealing the package or housing have generally been employed in radio communication using frequencies lower than those of quasi millimeter waves. External terminals formed on the housings of the individual devices are linked by a cable, whereby a sub system of a radio communication system is constructed. When a cable and connectors are used to connect a microwave circuit and antenna element, there arises a problem that a signal deteriorates during transmission. In particular, millimeter waves suffer from a large loss while propagating on a dielectric substrate made of alumina or the like. As disclosed in, for example, Japanese Unexamined Patent Publication No. 56-17842 or 57-44241, a transmission line based on a waveguide is often employed. However, the waveguide requires precision machining of metallic materials and does not therefore contribute to realization of a compact and inexpensive system.

As far as the frequency band of millimeter waves, for example, a frequency of 30 GHz, is concerned, since the dimension of an antenna element itself is 1 cm, the size of a radio-frequency radiation window becomes 3 cm. The size of the antenna does not become very critical. Sealing an antenna element and millimeter-wave circuit integrated into one module is therefore preferable for constructing a compact and inexpensive system because it obviates the necessity of using a cable, connectors, and a waveguide.

Japanese Unexamined Patent Publication No. 63-316905 has disclosed a structure using no waveguide. According to the disclosed structure, an antenna and semiconductor modules for transmission and reception can be linked without the use of a cable, connectors, or a waveguide. However, generally, a millimeter-wave circuit is formed on a GaAs semiconductor substrate and an antenna element is formed on a dielectric substrate made of a ceramic or the like. These substrates must be affixed to each other. The heat conductivity of the ceramic substrate on which the antenna element is formed is lower by one decade or more than that of copper or tungsten. The heat dissipation of semiconductor devices constituting a millimeter-wave circuit is a problem.

For solving such a problem, it is conceivable to arrange an antenna element and semiconductor circuit on the same surface of one metallic block so as to produce a compact and inexpensive semiconductor module for handling millimeter waves. However, even this structure has various drawbacks depending on how it is utilized actually. The first problem is directivity. For example, radio waves to be radiated from an antenna element are radiated to spread at a relatively large angle. This poses a problem that as a distance gets longer, it becomes impossible to transmit radio waves of a sufficient strength. Providing a larger output for solving this problem merely leads to an increase in circuit scale and is difficult to do from the viewpoint of radio-wave interference. It is also conceivable to improve directivity by employing an array antenna made by arranging a plurality of antenna patterns. This merely leads to an increase in size of a module. Besides, there arises a problem of a loss suffered by a signal during transmission to an antenna element. On the contrary, it may be necessary to radiate radio waves at a wider angle or receive the radio waves at a wider angle.

In relation to the foregoing problems, it becomes a problem how to efficiently radiate radio waves output from an antenna element to the outside or how to efficiently catch extraneous radio waves incident on an electromagnetic-wave radiation window using the antenna element. The efficiencies must be improved further.

In a module, an antenna element and semiconductor circuit are accommodated in a sealing cover. This poses a problem that radio waves radiated from the antenna element and those radiated from the semiconductor circuit affect each other. Moreover, the sealing cover is located closely to these components and therefore affects the components. These adverse effects produce noise to deteriorate the performance of the module.

SUMMARY OF THE INVENTION

The present invention attempts to solve the foregoing problems. An object of the present invention is to further improve a semiconductor module having an antenna element therein.

To accomplish the above object, according to the first aspect of the present invention, an electromagnetic-wave radiation window is designed to have the capability of a lens. This makes it possible to set directivity arbitrarily. For improving directivity, a convergent lens for converging millimeter waves or quasi millimeter waves is employed. For reducing directivity, a divergent lens is employed. In the case of the convergent lens, a direction in which radio waves to be radiated or received by the antenna element propagate can be set by deviating the center axis of the lens from the center of an antenna element.

The characteristics of parts of the lens may be different. For example, the center part of the lens can be convergent and the perimetric part thereof adjacent to an airtight sealing unit can be divergent. Owing to this structure, only radio waves passing through the center part of the lens can be validated and radio waves passing through the perimeter part can be invalidated. The airtight sealing unit is a conductor. Radio waves incident on the means induce a very small current, and affect a nearby electric field. Radio waves passing through the electric field are therefore adversely affected. The structure makes it possible to invalidate these radio waves.

Moreover, the lens may include a plurality of convergent lenses whose center axes are deviated in different directions from the center of an antenna element. This structure can exhibit directivity in a plurality of directions.

The lens is nonconducting, while the airtight sealing unit is a conductor. The lens may therefore be made of a nonconducting material and sealed airtightly using the conducting airtight sealing unit. For example, the lens and airtight sealing unit may be formed as a unit that is a cover member using a conducting material, and a conducting member may be coated over the surface of the cover member except an area thereof opposed to an antenna element. In general, a glass such as borosilicate glass or covar glass is used as a nonconducting material for perfect airtight sealing. As long as perfect airtight sealing can be achieved, any material will do. The conducting member to be coated over the surface of the cover member may be coated over the inner or outer surface thereof.

The lens may be circular or rectangular or have any other shape. The shape of the lens is determined according to the shape of a semiconductor module. Moreover, if the lens has one of the surfaces thereof formed as a plane, it can be manufactured easily. The lens may be placed with the plane thereof facing outside or inside. Placing the lens with the plane thereof facing inside is preferable in terms of aberration. Placing the lens with the plane thereof facing outside is helpful in maintenance of a module such as cleaning.

According to the second aspect of the present invention, a radio-wave absorbent is attached to the perimeter of a radio-wave radiation window adjacent to an airtight sealing unit. Radio waves passing through a part of the radio-wave radiation window adjacent to the airtight sealing unit are thus cut off, whereby noise is minimized. This is also applicable to a radio-wave radiation window that is a lens.

According to the third aspect of the present invention, a reflection reduction plate made of a material different from the material of a radio-wave radiation window and having a thickness thereof set so that surface reflection of millimeter waves or quasi millimeter waves from the radio-wave radiation window can be suppressed is attached to at least one surface of the radio-wave radiation window. The principle of the reflection reduction plate is the same as that of an anti-reflection film which is generally employed in the field of optics. By affixing a reflection reduction plate having a thickness of ¼ to one surface of the radio-wave radiation window, the surface reflectance can be minimized. The reflection reduction plate may be attached to the surface of the lens. As mentioned previously, the radio-wave radiation window or lens must be sealed airtightly, and is therefore made of borosilicate glass or covar glass. The reflection reduction plate is merely affixed to the surface, has no relation to airtight sealing, and can therefore be made of polyethylene or fluorocarbon resin.

Furthermore, according to the fourth aspect of the present invention, a sheet polarizer for selectively passing some of the incident millimeter waves or quasi millimeter waves which are polarized in a specific direction is placed on a radio-wave radiation window. A sheet polarizer for selectively passing only millimeter waves polarized in a specific direction is well-known. Once a polarization direction is set in a specific transmitter and receiver using the sheet polarizer, selective communication can be carried out. The sheet polarizer can be rotated continuously about an axis perpendicular to the surface of an antenna element or can be set to a rotated state at intervals of a given angle, and should preferably be adjustable according to the positional relationship between a transmitter and receiver. In this case, since it is preferred that directivity is high, an electromagnetic-wave radiation window should be a convergent lens.

Moreover, in relation to the fourth aspect, the convergent lens whose center axis is slanted with respect to the surface of the antenna element may be designed so that the direction of the center axis can be changed about the axis perendicular to the surface of the antenna element, and thus allowed to exhibit directivity in a specific direction. Also, the lens may be made adjustable.

Furthermore, according to the fifth aspect of the present invention, a plurality of pairs of an antenna element and radio-wave radiation window may be included. This results in a larger module. However, for example, in a transmitter receiver, antennas having independent directivity can be used separately for transmission and reception. This structure will be able to cope with multiple purposes.

Furthermore, according to the sixth aspect of the present invention, a radio-wave absorbent is coated over the surface of an airtight sealing unit opposed to an airtightly sealed component except an area of the surface opposed to an antenna element. The surface of the radio-wave absorbent is, for example, irregular. Preferably, another radio-wave absorbent is placed between the border between the antenna element and a semiconductor circuit and the airtight sealing unit. Radio waves are radiated not only from the antenna element but also from the semiconductor circuit. A semiconductor module of the present invention is covered with an airtight sealing unit that is conducting except a part of the semiconductor module serving as an electromagnetic-wave radiation window opposed to an antenna element. Radio waves radiated from the antenna element and semiconductor circuit hit the airtight sealing unit. Some of these radio waves are absorbed to cause a current to flow, while others are reflected to hit the antenna element and semiconductor circuit. This results in noise. Since the radio-wave absorbent is coated over the surface of the airtight sealing unit except the electromagnetic-wave radiation window, reflection of radio waves from the surface can be reduced and noise can be minimized. The radio-wave absorbent is made of, for example, a resin having a ferrite dispersed therein and applied to the inner surface of the airtight sealing unit. When the surface of the radio-wave absorbent is made irregular, the area of the surface increases and the occurrence of resonance can be prevented. Moreover, the strength of radio waves output from the antenna element is large. If radio waves hit the semiconductor circuit, the semiconductor circuit would be adversely affected. Owing to the radio-wave absorbent placed between the border between the antenna element and semiconductor circuit and the airtight sealing unit, radio waves output from the antenna element towards the semiconductor circuit can be minimized successfully.

In this structure, an angle at which radio waves spread is determined by an antenna pattern and limited to an angle at which radio waves radiate from the antenna element to the electromagnetic-wave radiation window. For increasing the angle at which radio waves radiated or received by a module spread, the angle at which radio waves radiate from the antenna element to the electromagnetic-wave radiation window must be increased. For increasing the angle at which radio waves radiate, the distance of the surface of the antenna element from the electromagnetic-wave radiation window must be shortened. The distance from a sealing cover serving as the airtight sealing unit to which the electromagnetic-wave radiation window is attached must be shortened. As far as a semiconductor circuit is concerned, when the distance from the sealing cover is shortened, there arises a problem that it becomes difficult to apply a radio-wave absorbent or the like, and noise caused by radiated radio waves increases accordingly. For solving this problem, the spacing between a part of a substrate on which the antenna element is formed and the radio-wave radiation window opposed to the part should be narrower than the spacing between a part of the substrate on which the semiconductor circuit is formed and the airtight sealing unit opposed to the part. Specifically, the level of the surface of the substrate is made different between the part of the substrate on which the antenna element is formed and the part thereof on which the semiconductor circuit is formed so that the part thereof on which the antenna element becomes higher than the part thereof on which the semiconductor circuit is formed. In this case, an inclined plane links the part of the substrate on which the antenna element is formed and the part thereof on which the semiconductor circuit is formed. Alternatively, the level of the surface of the airtight sealing unit may be made different between a part of the surface opposed to the antenna element and a part thereof opposed to the semiconductor circuit so that the part thereof opposed to the antenna element becomes lower than the part thereof opposed to the semiconductor circuit. In this case, the radio-wave radiation window may be attached to the inner surface or outer surface of the airtight sealing unit.

BRIEF DESCRIPTION OF THE DRAWINGS

The present invention will be more clearly understood from the description as set below with reference to the accompanying drawings, wherein:

FIG. 2B is an enlarged diagram of part of FIG. 2A;

FIG. 3A shows a top view, and FIG. 3B shows a sectional view;

FIG. 5A shows a top view, and FIG. 5B shows a sectional view;

FIG. 6A shows a top view, and FIG. 6B shows a sectional view;

FIG. 16A shows a top view, and FIG. 16B shows a sectional view;

FIG. 17A shows a top view, and FIG. 17B shows a sectional view;

FIG. 20A shows a polarizer, FIG. 20B shows a top view of the module, and FIG. 20C shows a sectional view of the module;

FIG. 24A shows a top view, and FIG. 24B shows a sectional view;

DESCRIPTION OF THE PREFERRED EMBODIMENTS

Before proceeding to a detailed description of the preferred embodiments of the present invention, a prior art semiconductor module having an antenna element will be described for a better understanding of the differences between the present invention and the prior art.

Figure 1:
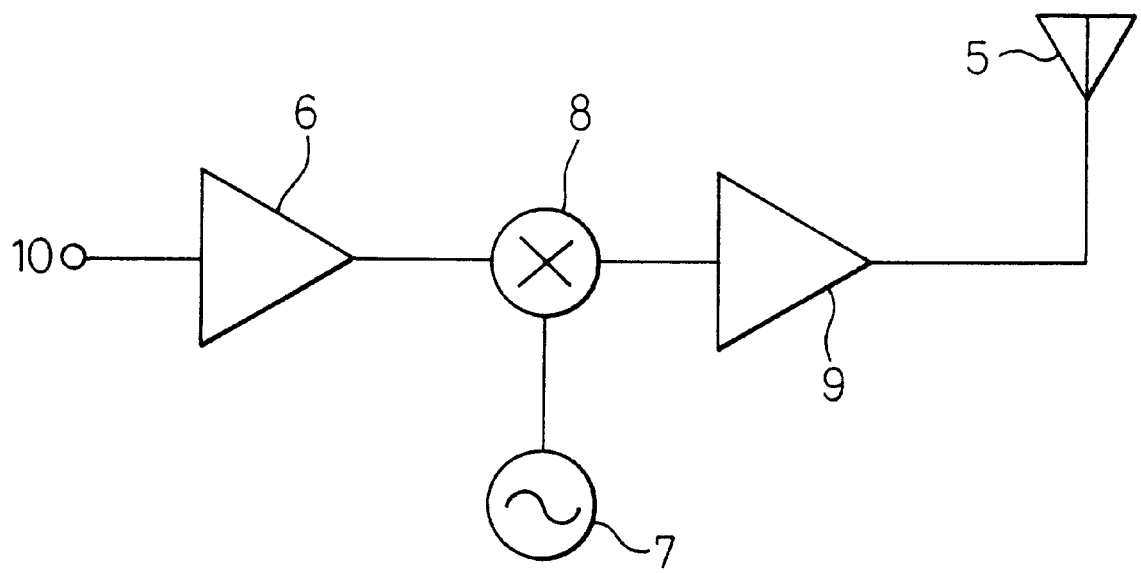
FIG. 1 is a block diagram showing an example of the basic configuration of a semiconductor module that is an object of the present invention.

FIG. 1 is a diagram showing basic circuitry in a transmitter for transmitting millimeter waves. Intermediatefrequency (IF) waves are input to an input terminal 10, and amplified by an IF signal amplifier 6. Carrier-frequency waves sent from a local oscillator 7 are modulated by a frequency mixer circuit according to an output of the IF signal amplifier 6, and then radiated from a transmission antenna 5. In a receiver, on the contrary, millimeter waves received by a reception antenna are amplified. Thereafter, carrier-frequency waves sent from a local oscillator are mixed by a mixer circuit. Thus, an IF signal is detected and extracted.

Figure 2A:
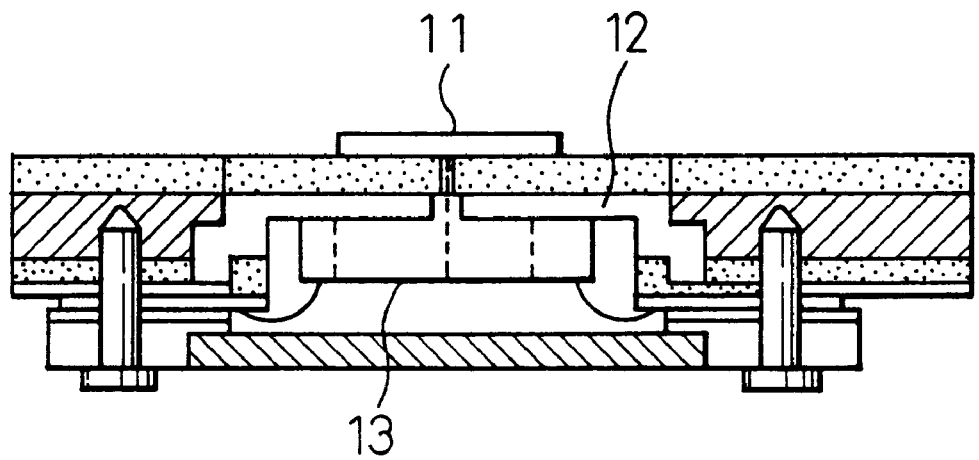
FIGS. 2A and 2B are diagrams showing an example of the structure of a conventional semiconductor module produced by affixing a substrate having a semiconductor circuit formed on the back of a substrate on which an antenna element is formed.
Figure 2B:
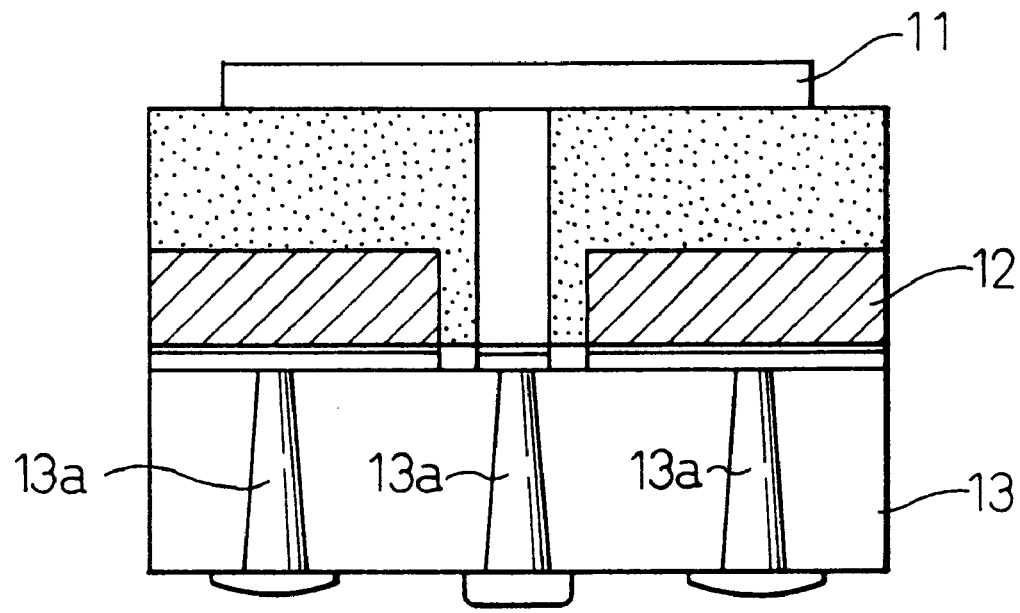

FIGS. 2A and 2B are diagrams showing an example of the structure of a module using no waveguide disclosed in Japanese Unexamined Patent Publication No. 63-316905. FIG. 2B is an enlarged diagram of part of FIG. 2A. This structure is such that a connection line of the antenna 11 is led to the back of a substrate, and a microwave integrated circuit 13 having via holes 13a is connected on the connection line via a package 12. This structure makes it possible to connect an antenna and semiconductor module for transmission and reception without a cable, connectors, and waveguide. Generally, a millimeter-wave circuit is formed on a GaAs semiconductor substrate, and an antenna element is formed on a dielectric substrate made of a ceramic or the like. For the structure shown in FIGS. 2A and 2B, the substrates are affixed to each other. However, the heat conductivity of the ceramic substrate on which the antenna element is formed is lower, by one decade or more, than one of copper or tungsten. The heat dissipation of semiconductor devices constituting the millimeter-wave circuit becomes a problem.

Figure 3A:
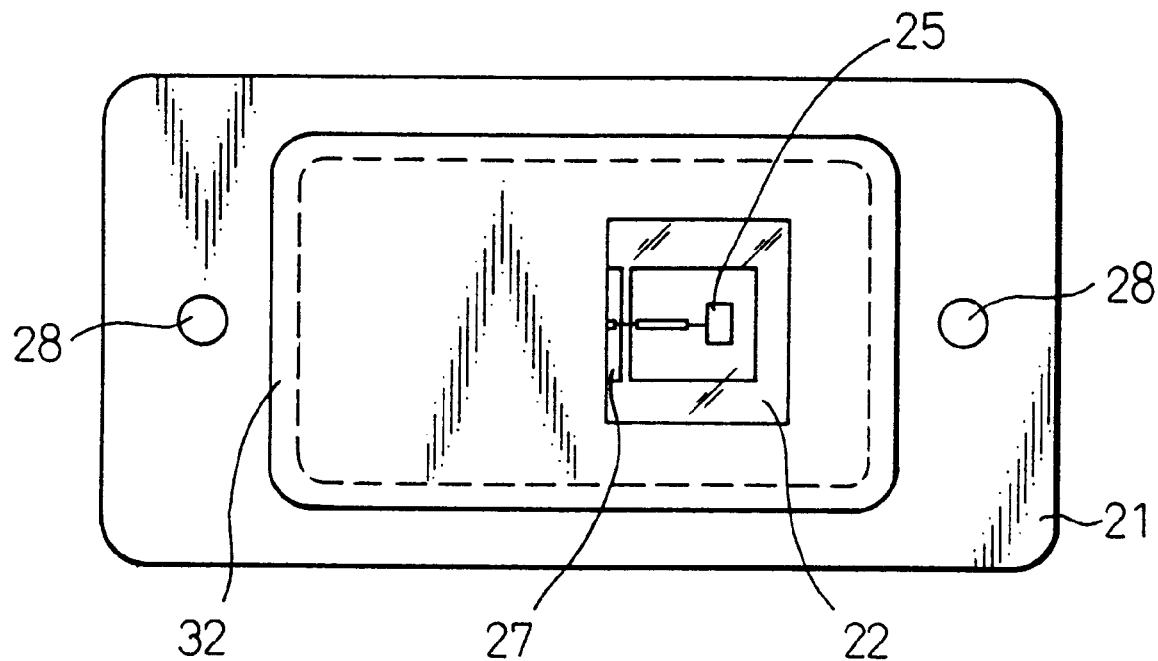
FIGS. 3A and 3B are diagrams showing an example of a structure of a module produced by placing an antenna element and semiconductor circuit on the same surface of one metallic block.
Figure 3B:
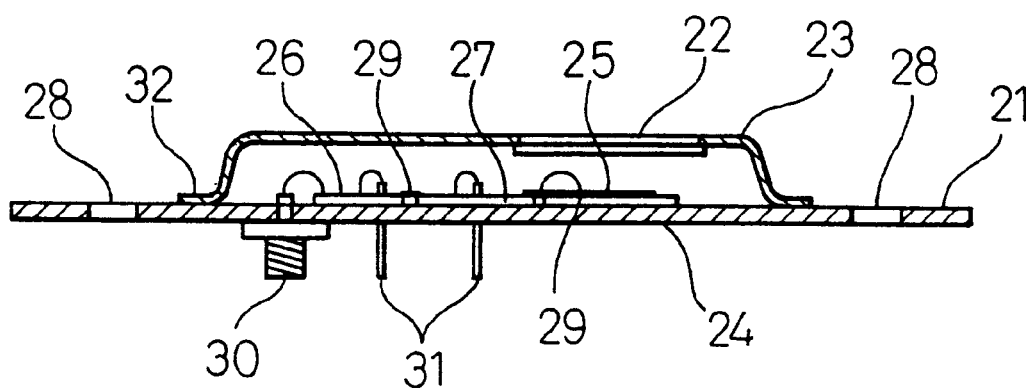

For solving the above problem, it is conceivable to construct a module by arranging an antenna element and semiconductor circuit on the same surface of one metallic block. FIGS. 3A and 3B are diagrams showing an example of the structure of such a semiconductor module, FIG. 3 shows a top view, and FIG. 3B shows a sectional view. As shown in FIGS. 3A and 3B, a dielectric substrate 24 on which an antenna element 25 is formed and GaAs semiconductor substrates 26 and 27 on each of which a semiconductor circuit for handling millimeter waves is formed are arranged on a substrate 21 made of a conducting material such as copper, and then interconnected. A sealing cover 23 made of a conducting material is placed to cover the antenna element and semiconductor circuits, and attached to the substrate 21 by performing brazing, laser-welding, electric welding, or screwing with packing on an airtight sealing portion 32 of the sealing cover. Thus, airtight sealing is achieved. The antenna element 25 is a flat antenna such as a patch antenna or slot antenna. An electromagnetic-wave radiation window 22 is formed in an area of the sealing cover 23 opposed to the antenna element 25. The electromagnetic-wave radiation window 22 is also sealed airtightly to be locked in the sealing cover 23. Reference numeral 28 denotes a screw hole used to attach the module, 30 denotes a terminal through which an IF signal is supplied, and 31 denotes a power terminal.

An example of constructing the antenna element as a patch antenna will be described briefly. In this case, a quartz substrate having a thickness ranging from 200 to 500 micrometers is used as the dielectric substrate 24. A thin gold film having a thickness of several micrometers is coated as a ground-potential conductor over the back of the quartz substrate, and an antenna pattern like the illustrated one is formed on the other surface of the quartz substrate using a thin gold film having a thickness of several micrometers. The size of a patch board portion of the antenna pattern is equivalent to the wavelength of radio waves employed. The electromagnetic-wave radiation window 22 should preferably have a size several times larger than the size of the patch board portion of the antenna pattern.

Airtight sealing is achieved in an inactive gas environment containing gaseous nitrogen or the like. An inactive gas is enclosed in the inside of the sealing cover. Consequently, the environment inside the module is stabilized and the characteristics of the module as radio equipment are stabilized.

Owing to the structure shown in FIGS. 3A and 3B, a compact and inexpensive semiconductor module for handling millimeter waves can be realized. The structure shown in FIGS. 3A and 3B can be adapted to a receiver in the same manner.

The structure shown in FIGS. 3A and 3B realizes a compact and inexpensive semiconductor module for handling millimeter waves. For some usages, as mentioned previously, directivity, efficiency, and mutual interferences of radio waves radiated from the antenna element and semiconductor circuits and from the antenna element and semiconductor circuits and the sealing cover become problems.

Referring to FIGS. 4 to 33, embodiments of the present invention will be described. Semiconductor modules of the embodiments of the present invention have structures similar to the one shown in FIGS. 3A and 3B. Only differences from the structure shown in FIGS. 3A and 3B will be described. The same reference numerals are assigned to functional parts identical to the components shown in FIGS. 3A and 3B. The description of the functional parts will be omitted.

Figure 4:
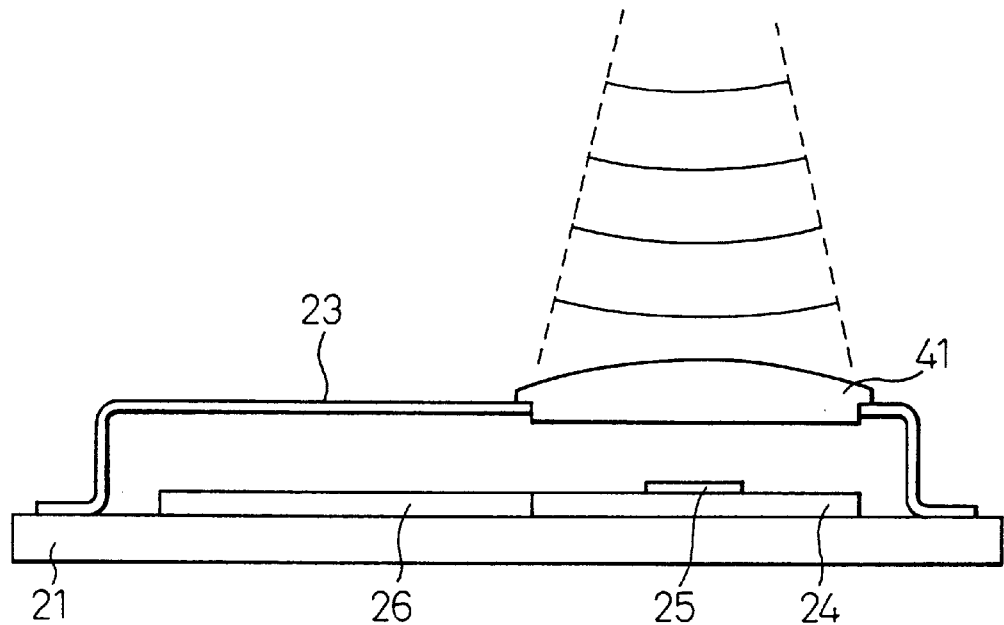
FIG. 4 is a diagram showing the structure of a module of the first embodiment of the present invention.

FIG. 4 is a diagram showing the structure of a semiconductor module of the first embodiment of the present invention. A difference from the structure shown in FIGS. 3A and 3B lies in a point that the electromagnetic-wave radiation window 22 is a convergent lens 41 working to converge millimeter waves, or more particularly, a convex lens. The convex lens 41 is made of borosilicate glass or covar glass and locked in the conducting cover 23 by performing brazing, laser-welding, or electric welding. However, a plastic material will also do as long as it can be locked perfectly. Using the convergent lens, radio waves radiated from the antenna element are converged to exhibit high directivity.

Figure 5A:
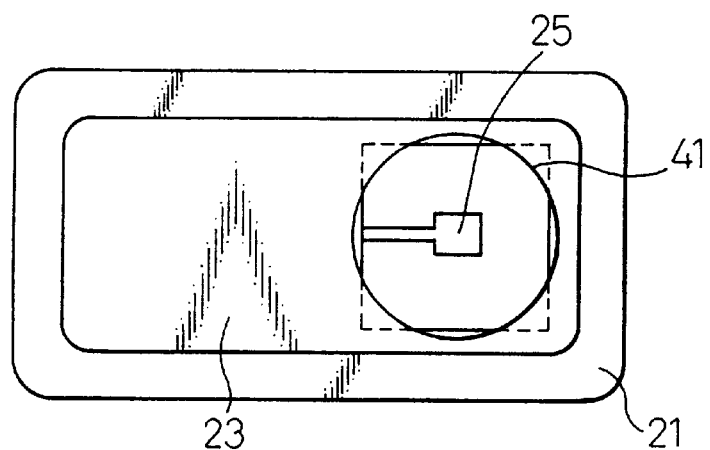
FIGS. 5A and 5B are diagrams showing an example of the shape of a lens in the first embodiment.
Figure 5B:
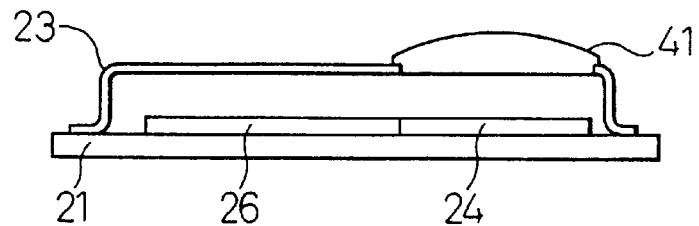
Figure 6A:
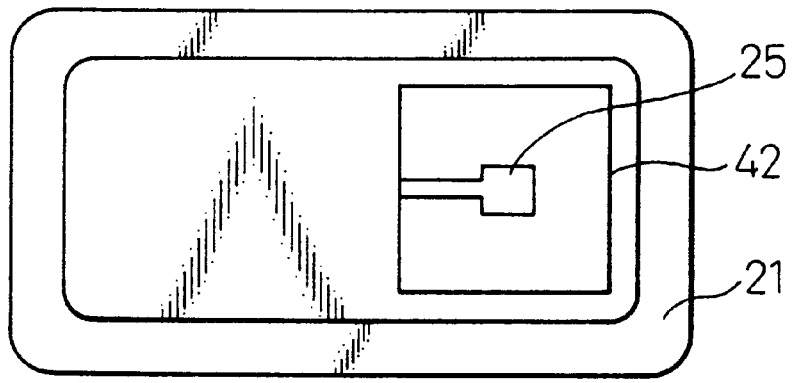
FIGS. 6A and 6B are diagrams showing another example of the shape of a lens in the first embodiment.
Figure 6B:
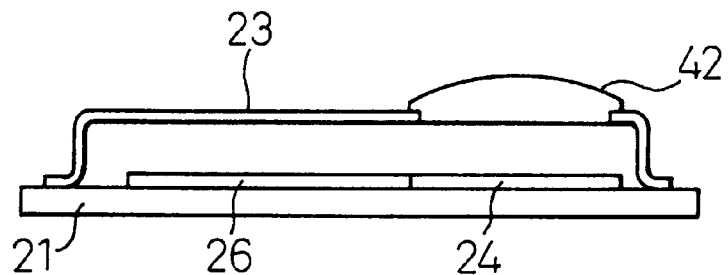

FIGS. 5A and 5B and FIGS. 6A and 6B are diagrams showing an example of the shape of a lens in the first embodiment. FIGS. 5A and 5B show a circular lens, and FIGS. 6A and 6B show a rectangular lens. The shape of the lens is determined appropriately according to the antenna pattern 25 and the radiation characteristic concerning radiation to the outside.

Figure 7:
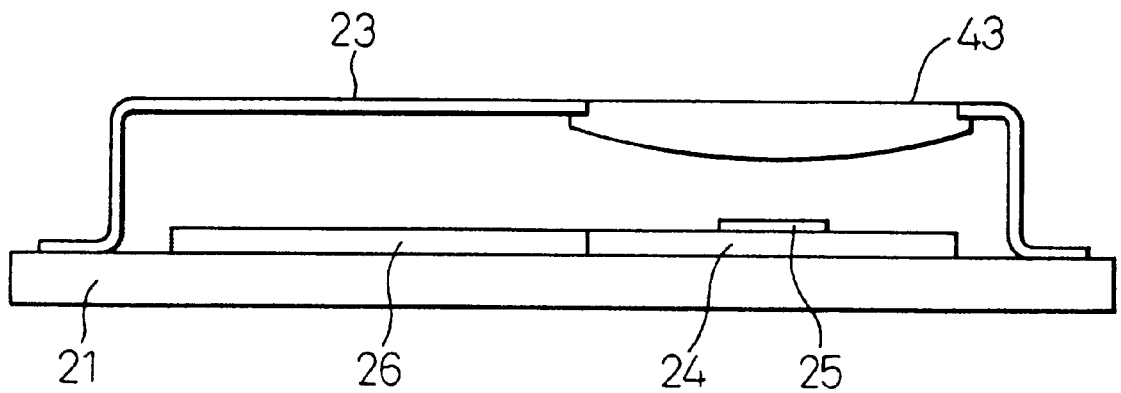
FIG. 7 is a diagram showing the first variant of the first embodiment.

In FIG. 4, FIGS. 5A and 5B, and FIGS. 6A and 6B, the convex lens is a plano-convex lens that is placed with the convex surface facing outside. Alternatively, as shown in FIG. 7, the plano-convex lens may be placed with the convex surface thereof facing inside. This placement facilitates cleaning or the like of the lens surface. From the viewpoint of aberration, however, the plano-convex lens should be placed with the convex surface thereof facing outside because aberration is reduced. However, in practice, aberration does not pose a serious problem.

Figure 8:
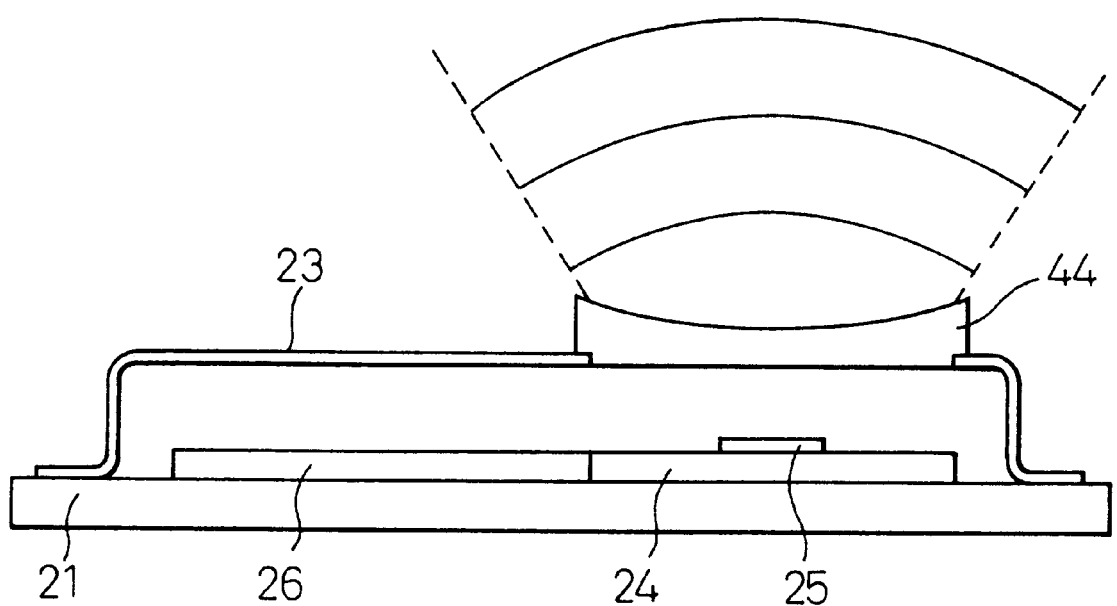
FIG. 8 is a diagram showing the second variant of the first embodiment.

FIG. 8 is a diagram showing a variant in which a divergent concave lens 44 is employed. The employment of such a concave lens makes it possible to spread radiated radio waves in a wide angular range or receive radio waves within a wide angular range. The shape of the lens is determined appropriately according to the antenna pattern 25 and the radiation characteristic concerning radiation to the outside.

Figure 9:
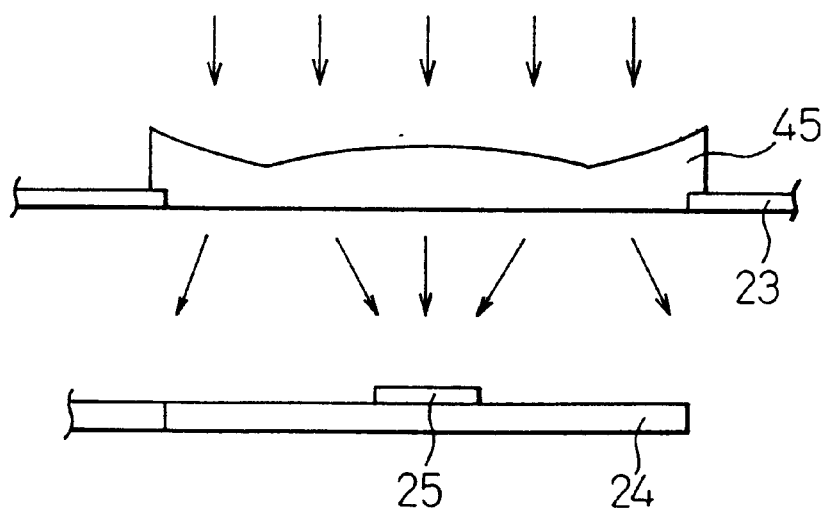
FIG. 9 is a diagram showing the third variant of the first embodiment.

The characteristics of parts of the lens may be different. For example, as shown in FIG. 9, the lens may be a lens 45 whose center part is convergent and whose perimeter part adjacent to the sealing cover 23 is divergent. The center axis of the convex lens portion of the center part aligns with the center of the patch antenna. Assuming that radio waves are radiated in a direction perpendicular to the antenna element and radio waves propagating in the direction are received, radio waves incident in the center part in the perpendicular direction are converged at the center of the patch antenna. Radio waves propagating in the same perpendicular direction but incident on the concave lens portion of the perimetric part are divergent but do not converge at the center of the patch antenna. Using the lens having the shape shown in FIG. 9, only radio waves passing through the center part of the lens are validated and radio waves passing through the perimetric part thereof are invalidated.

The sealing cover 23 is conducting. Radio waves incident on the sealing cover 23 induce a very small current that affects a nearby electric field. Eventually, radio waves passing through the electric field are adversely affected. Among radio waves passing through the lens 45, radio waves passing through the perimetric part are adversely affected by the margin of the sealing cover 23. However, when the lens 45 shown in FIG. 9 is employed, since radio waves passing through the perimetric part of the lens are not converged at the center of the patch antenna, they are therefore not converted into an electric signal. Thus, the adverse effect is minimized.

Figure 10:
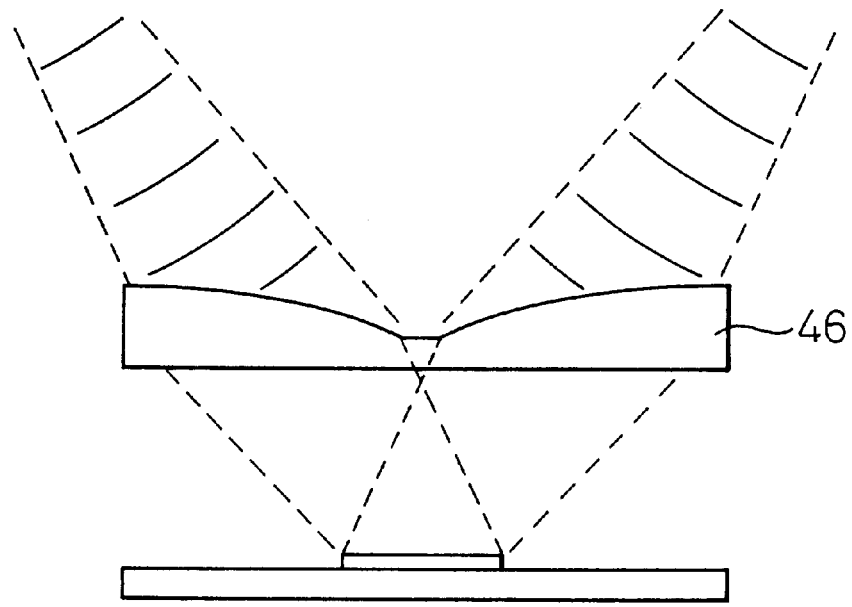
FIG. 10 is a diagram showing the fourth variant of the first embodiment.
Figure 11:
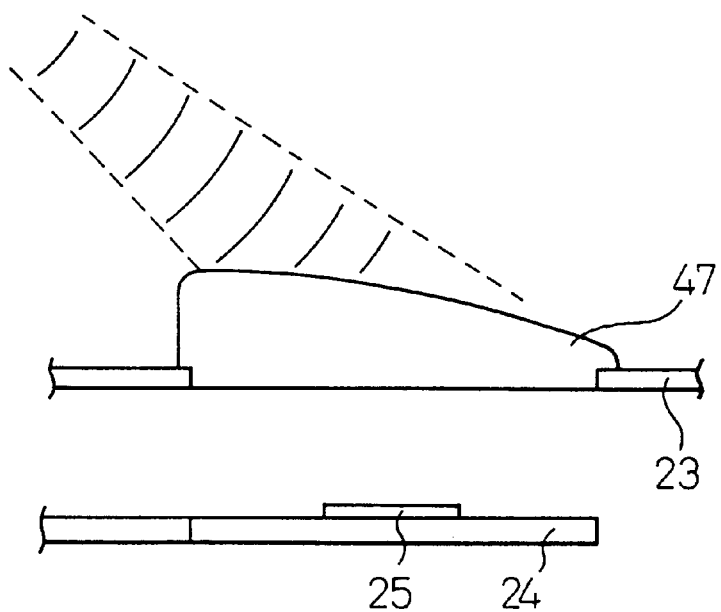
FIG. 11 is a diagram showing the fifth variant of the first embodiment.
Figure 12:
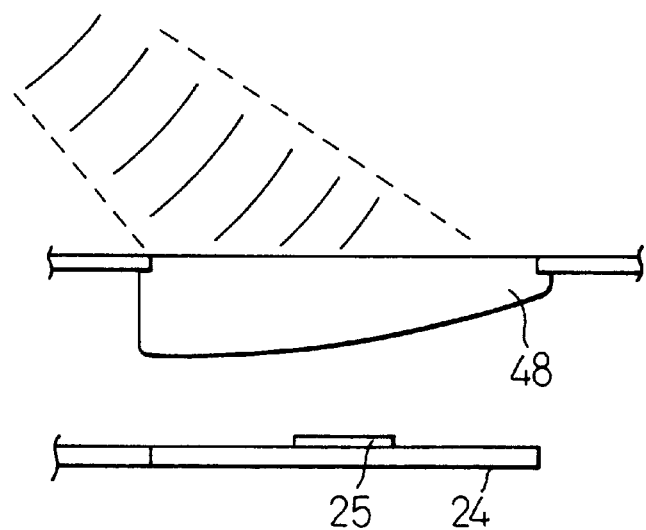
FIG. 12 is a diagram showing the sixth variant of the first embodiment.

In the aforesaid examples, a lens exhibits directivity in one direction alone. Alternatively, a lens 46 exhibiting directivity in a plurality of directions as shown in FIG. 10 may be employed. The direction in which a convex lens exhibits directivity is determined with the positional relationship of the center axis of the lens to the center of an antenna pattern. For example, in FIG. 11, the center axis of a convex lens 47 is deviated leftward from the center of the antenna element 25. Owing to the deviation, radiated radio waves are directed toward the left, and radio waves coming from the left are converged at the center of the antenna element 25. In other words, the convex lens 47 shown in FIG. 11 is shaped like placing the convex lens shown in FIG. 4 on a prism whose left part has a larger thickness. The convex lens 47 exhibits directivity in the left owing to the prism and exhibits directivity in another direction owing to the convex lens. The number of directions in which the lens exhibits directivity is not limited to two directions but may be three or four directions. Moreover, the lens 47 shown in FIG. 11 may be placed with the plane thereof facing outside like a lens 48 shown in FIG. 12.

Figure 13:
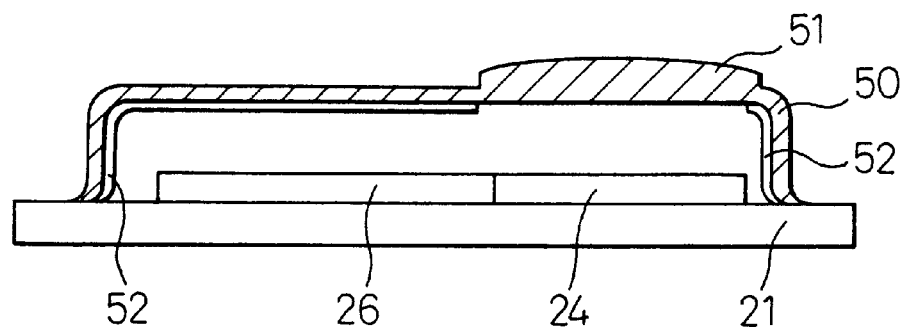
FIG. 13 is a diagram showing the first example of the structure of a sealing cover in the first embodiment.
Figure 14:
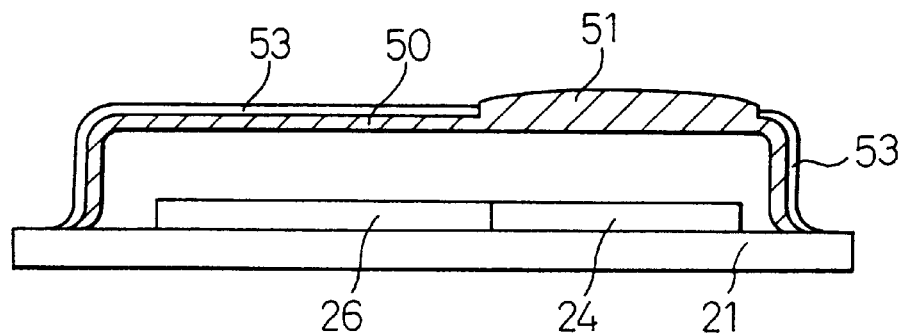
FIG. 14 is a diagram showing the second example of the structure of a sealing cover in the first embodiment.
Figure 15:
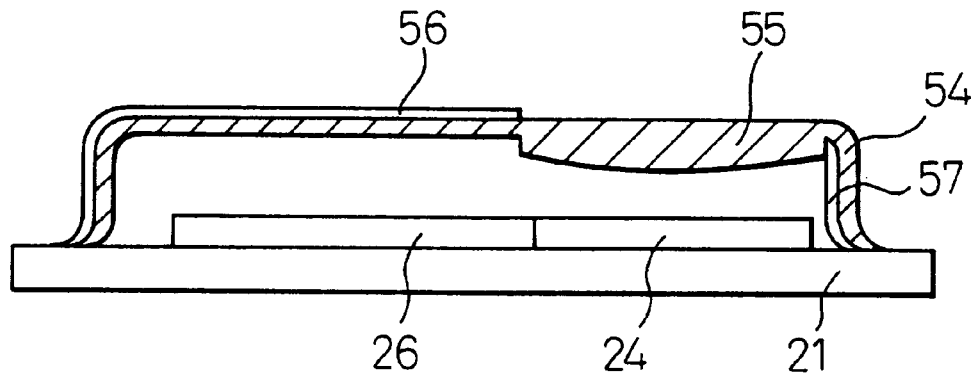
FIG. 15 is a diagram showing the third example of the structure of a sealing cover in the first embodiment.

Next, a method of manufacturing the aforesaid lenses in accordance with the first embodiment will be described. A lens is nonconducting, while an airtight sealing unit is conducting. The lens may therefore be made of a nonconducting material and sealed airtightly using the conducting airtight sealing unit. Alternatively, for example, a lens and airtight sealing means may be made of a nonconducting material as a unit that is a cover member, and a conducting member may be coated over the surface of the cover member except an area thereof opposed to an antenna element. FIGS. 13 to 15 are diagrams showing examples of this structure. For example, as shown in FIG. 13, a sealing cover 50 having a lens 51 as an integral part is made of borosilicate glass or covar glass, a conducting member 52 is coated over the inner surface of the sealing cover except a part of the inner surface serving as the lens 51, and then gaseous nitrogen or the like is injected for airtight sealing. For perfect sealing, generally, a glass such as borosilicate glass or covar glass is employed. As long as perfectly airtight sealing can be achieved, any material will do. The conducting member to be coated over the surface of the cover member may be coated over the inner surface as shown in FIG. 13 or over the outer surface as shown in FIG. 14. Moreover, as shown in FIG. 15, one surface of the lens may be a plane and the lens may be formed with the plane thereof facing outside.

Figure 16A:
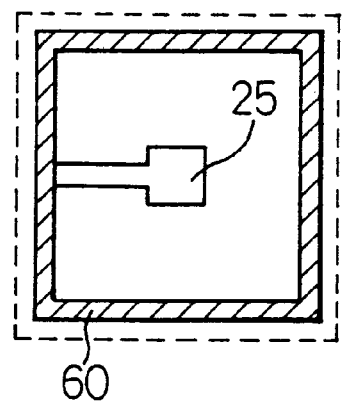
FIGS. 16A and 16B are diagrams showing the structure of a window of a module in accordance with the second embodiment of the present invention.
Figure 16B:
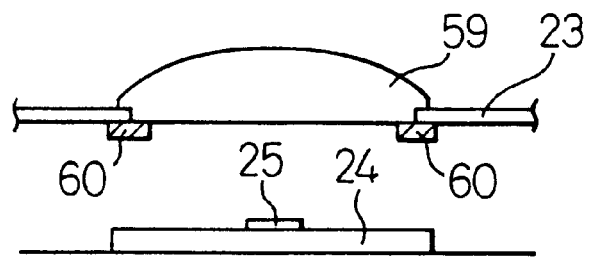
Figure 17A:
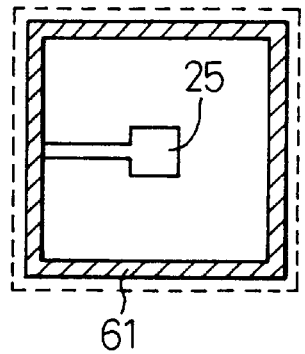
FIGS. 17A and 17B are diagrams showing another example of the structure of the window of the module in accordance with the second embodiment of the present invention.
Figure 17B:
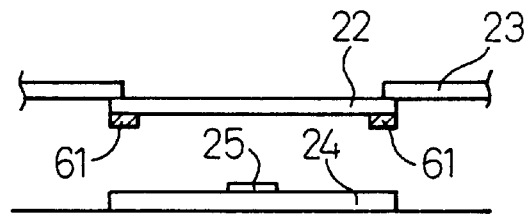

FIGS. 16A and 16B and FIGS. 17A and 17*b* are diagrams showing the structures of a semiconductor module of the second embodiment of the present invention. FIGS. 16A and 16B show a structure similar to the one shown in FIG. 4. A difference lies in a point that a radio-wave absorbent 60 is attached to the perimetric part of a convex lens 59 adjacent to the sealing cover 23. Owing to the radio-wave absorbent 60, radio waves passing through the perimetric part of the lens 59 and adversely affected by the margin of the sealing cover can be cut off. Consequently, noise is minimized. FIGS. 17A and 17B show an example in which a radio-wave absorbent 61 is attached to a part of the electromagnetic-wave radiation window shown in FIGS. 3A and 3B adjacent to the sealing cover 23.

Figure 18A:
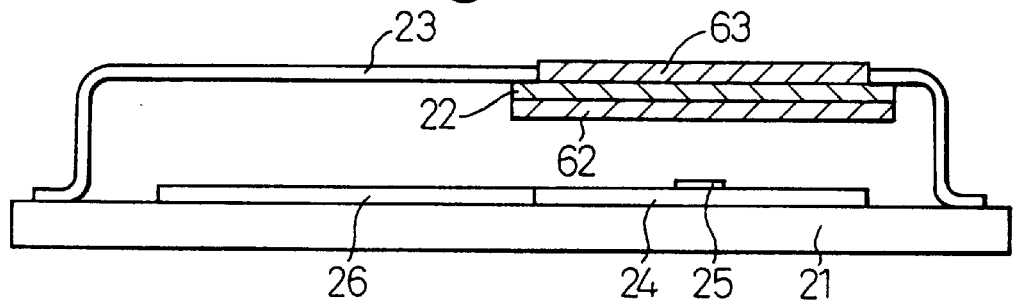
FIG. 18A is a diagram showing the structure of a module of the third embodiment of the present invention.
Figure 18B:
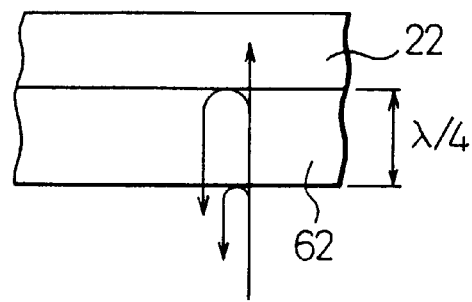
FIG. 18B is a diagram for explaining the principle of improving transmittance in the structure of the module of the third embodiment of the present invention.

In the field of optics, for reducing reflection from the surface of a lens or the like, a thin film made of a dielectric material having a different refractive index and having a thickness of ¼λ is coated over the reflection surface. Surface reflection of millimeter waves can be reduced according to a similar principle. FIG. 18A is a diagram showing the structure of a semiconductor module of the third embodiment having undergone this kind of anti-reflection processing. FIG. 18B is a diagram for explaining the principle. As illustrated, reflection reduction plates 62 and 63 are attached to both surfaces of the electromagnetic-wave radiation window 22.

Figure 19:
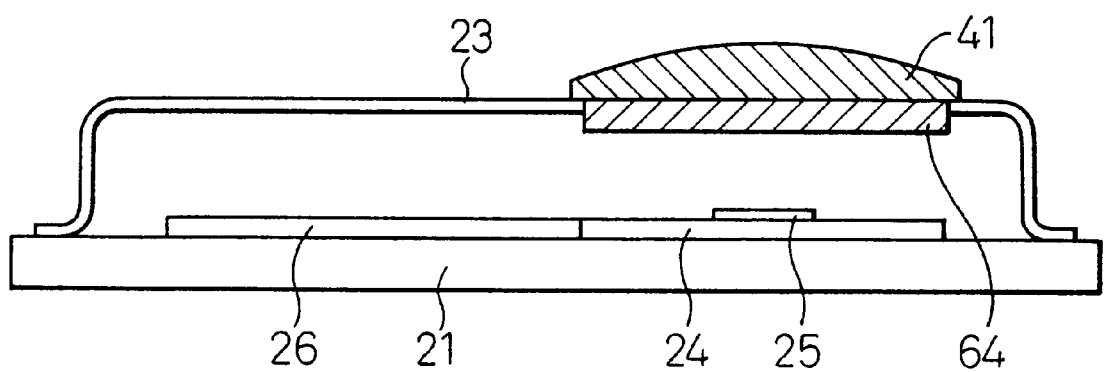
FIG. 19 is a diagram showing a lens member for a module of the fourth embodiment of the present invention.

For example, assuming that an intrinsic impedance against radio waves is $\eta$, a magnetic permeability is $\mu$, and a dielectric constant is $\epsilon$, $\eta=(\mu/\epsilon)^{1/2}$ is established. In a vacuum, $\eta 0$ equals to 377 ohms. If the magnetic permeability can be considered to be the same as that in the vacuum, assuming that a relative dielectric constant is $\epsilon r$, $\eta=377/(\epsilon r)^{1/2}$ is established. For example, when the electromagnetic-wave radiation window 22 is made of borosilicate glass, the relative dielectric constant $\epsilon r(2)$ is 4.8, and the intrinsic impedance $\eta(2)$ is 172 ohms. When the thickness of the reflection reduction plate 62 is ¼λ, if the impedance $\eta(1)$ produced by the reflection reduction plate 62 is $(\eta 0 \cdot \eta(2))^{1/2}$, the reflection reduction plate can be regarded as a matching plate. Based on this relationship, the relative dielectric constant $\epsilon(1)$ of the reflection reduction plate 62 is 2.19. This means that a plate having a thickness of ¼λ should be made of a material exhibiting this relative dielectric constant, for example, polyethylene or fluorocarbon resin and attached closely to the surface of the electromagnetic-wave radiation window. As long as a plate having the thickness and made of the material is employed, as shown in FIG. 19, radio waves reflected from the surface of the reflection reduction plate 62 and radio waves reflected from the electromagnetic-wave radiation window 22 are out of phase by a half wavelength and are mutually cancelled. This results in reduced reflection.

Surface reflection occurs on both surfaces of the electromagnetic-wave radiation window 22. The reflection reduction plate should preferably be attached to the both surfaces of the electromagnetic-wave radiation window 22. Moreover, if the thickness of the electromagnetic-wave radiation window 22 is optimized at the same time, transmittance can be maximized.

FIG. 19 is a diagram showing an example in which a reflection reduction plate 64 is attached to one surface of the lens 41 substituted for the electromagnetic-wave radiation window 22 in the structure shown in FIG. 4.

An electromagnetic-wave radiation window and lens must be sealed airtightly, and borosilicate glass or covar glass is therefore adopted. A reflection reduction plate is merely attached to a surface, has no relation to airtight sealing, and can therefore be made of polyethylene or fluorocarbon resin.

Figure 20A:
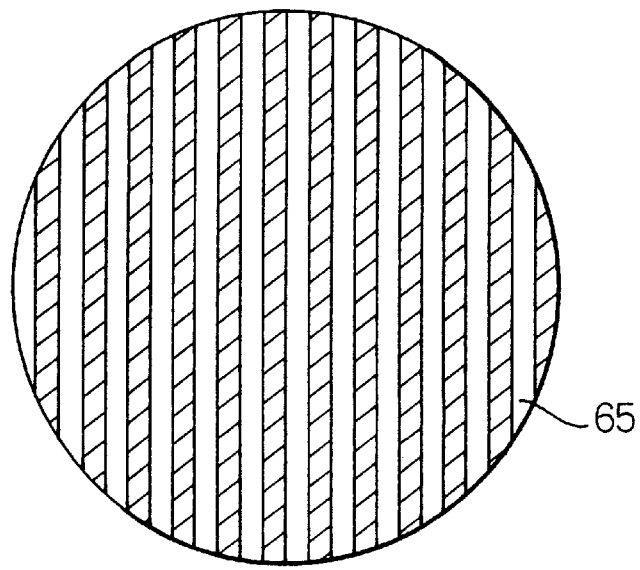
FIGS. 20A to 20C are diagrams showing the structure of a module of the fifth embodiment of the present invention.
Figure 20B:
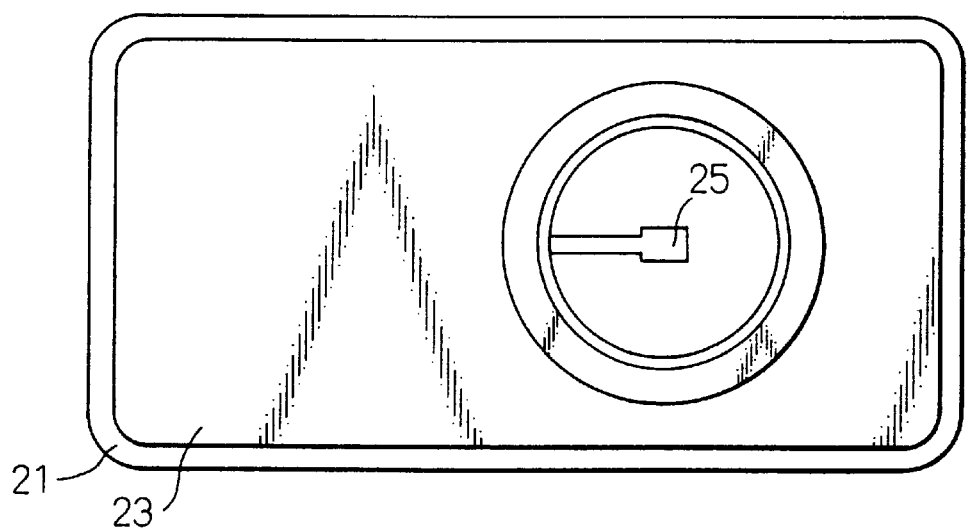
Figure 20C:
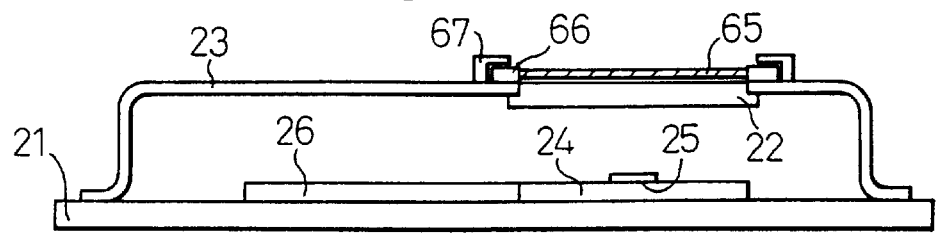

A sheet polarizer for selectively passing only millimeter waves polarized in a specific direction is well-known. When the sheet polarizer is used to set a polarization direction in a specific transmitter and receiver, selective communication can be achieved. FIGS. 20A to 20C are diagrams showing the structure of a semiconductor module of the fifth embodiment having such a sheet polarizer. FIG. 20A shows the structure of a polarizer, FIG. 20B shows a top view of the semiconductor module, and FIG. 20C shows a sectional view of the semiconductor module.

The sheet polarizer is, as shown in FIG. 20A, made by laminating two kinds of dielectrics having different dielectric constants, and selectively passes only millimeter waves polarized in a specific direction. The sheet polarizer 65 is, as shown in FIGS. 20B and 20C, placed rotatably on the electromagnetic-wave radiation window 22. Reference numeral 66 denotes a frame of the sheet polarizer 65, and 67 denotes a rotation guide with which the frame is engaged. Owing to this mechanism, the sheet polarizer 65 can be rotated continuously about an axis perpendicular to the surface of the antenna element 25. A mechanism for locking the sheet polarizer at a given rotational position is included but not shown.

Figure 21A:
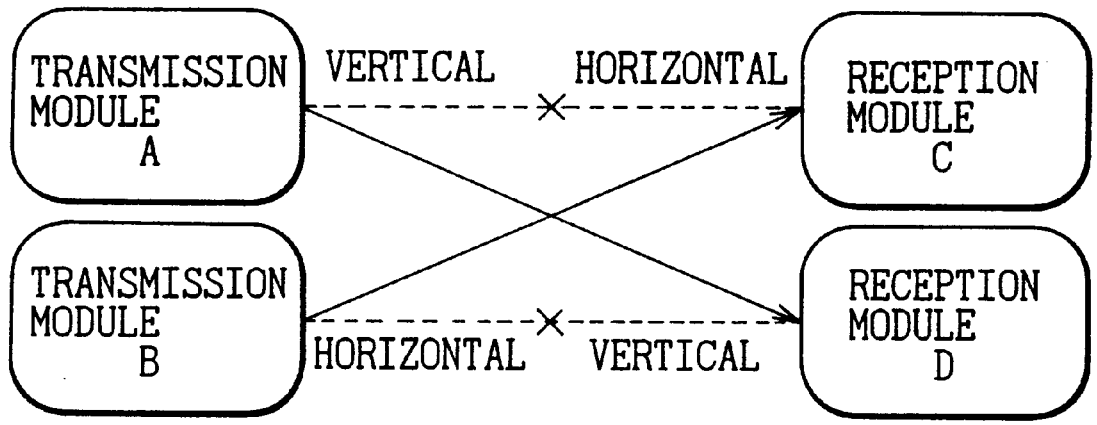
FIGS. 21A and 21B are diagrams showing use examples of a module of the fifth embodiment.
Figure 21B:
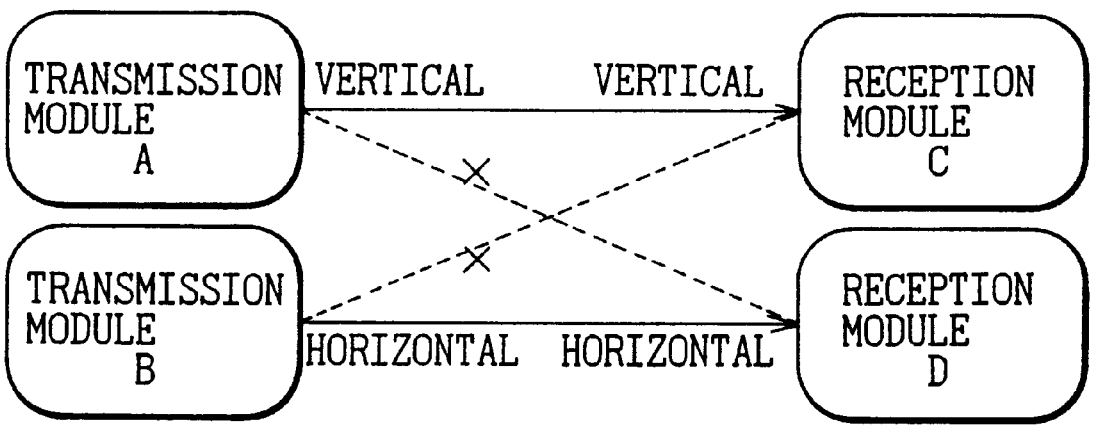

Next, a usage of the semiconductor module of the fifth embodiment will be described with reference to FIGS. 21A and 21B. Two transmission modules A and B are provided as transmitting sides, and two reception modules C and D are provided as receiving sides. The sheet polarizer 65 shown in FIGS. 20A to 20C shall be included in each module. For example, as shown in FIG. 21A, the sheet polarizer in the transmission module A is set to produce s-polarized waves, the one in the transmission module B is set to produce p-polarized waves, the one in the reception module C is set to produce p-polarized waves, and the one in the reception module D is set to produce s-polarized waves. Transmission and reception can be carried out between the pair of the modules A and D and the pair of the modules B and C. By contrast, it becomes hard for the pairs of the modules A and C and the modules B and D to receive radio waves. Transmission and reception cannot therefore be carried out between the pairs. Even when there are two transmission modules and two reception modules, a pair of modules for transmission and reception can be selectively specified. In the arrangement shown in FIG. 21A, when the sheet polarizers 65 included in the reception modules C and D are rotated 90° in order to change the polarization directions, as shown in FIG. 21B, the sheet polarizer in the transmission module A is set to produce s-polarized waves, the one in the transmission module B is set to produce p-polarized waves, the one in the reception module C is set to produce s-polarized waves, and the one in the reception module D is set to produce p-polarized waves. In this case, transmission and reception can be carried out between the pair of the modules A and C and the pair of the modules B and D.

Figure 22:
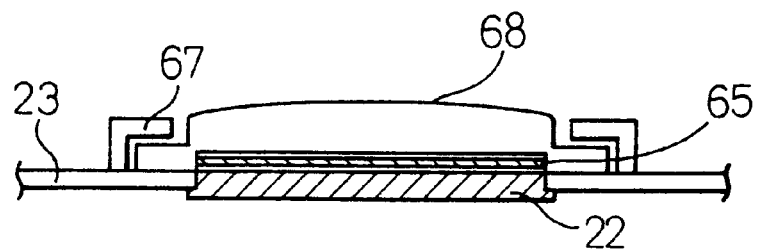
FIG. 22 is a diagram showing a variant of the module of the fifth embodiment.

In FIG. 22, a convergent lens 68 is added to the structure shown in FIGS. 20B and 20C. The convergent lens 68 and sheet polarizer 65 can be rotated together.

Figure 23A:
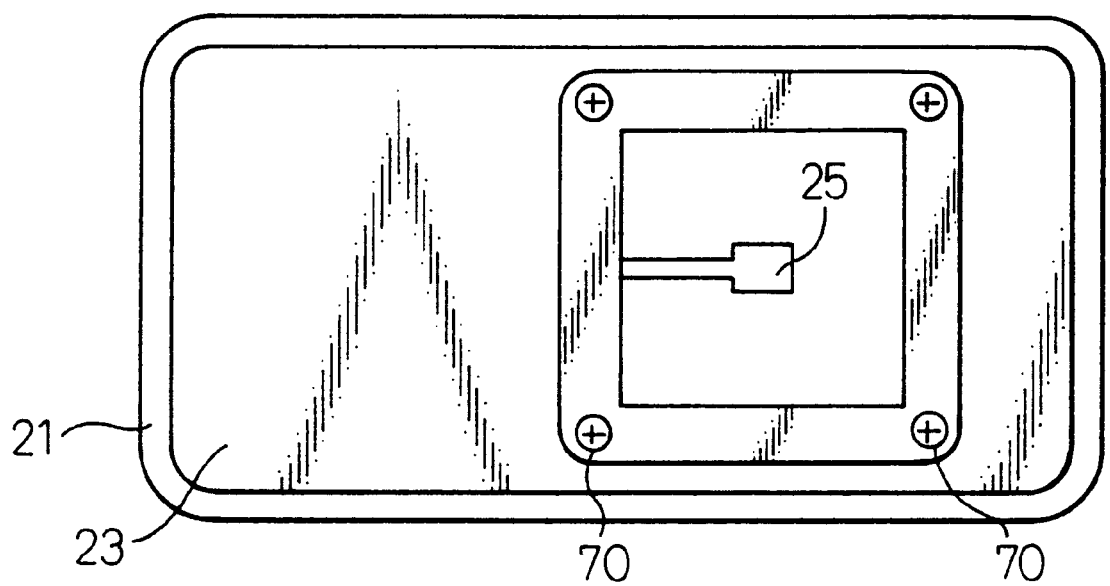
FIGS. 23A and 23B are diagrams showing another variant of the module of the fifth embodiment.
Figure 23B:
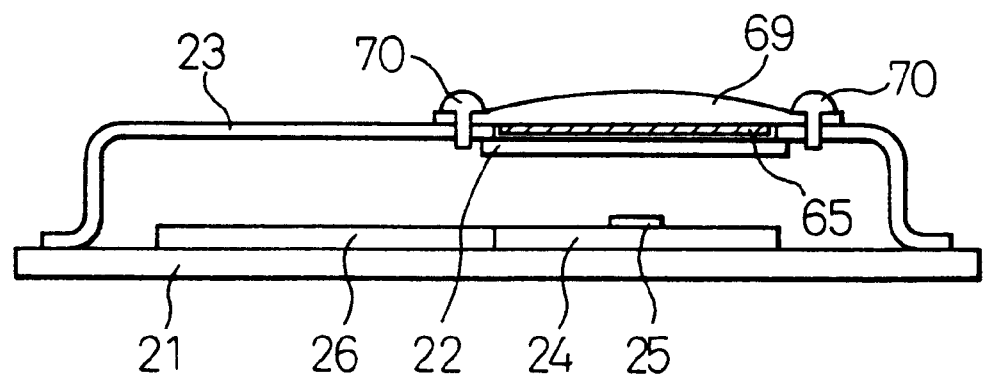

FIGS. 23A and 23B show a structure in which the convergent lens 68 and sheet polarizer 65 included in the structure shown in FIG. 22 cannot be rotated continuously but the polarization direction can be changed in units of 90°. After being unscrewed and dismounted, the sheet polarizer is mounted again with the direction thereof changed. Thus, the polarization direction can be changed.

Figure 24A:
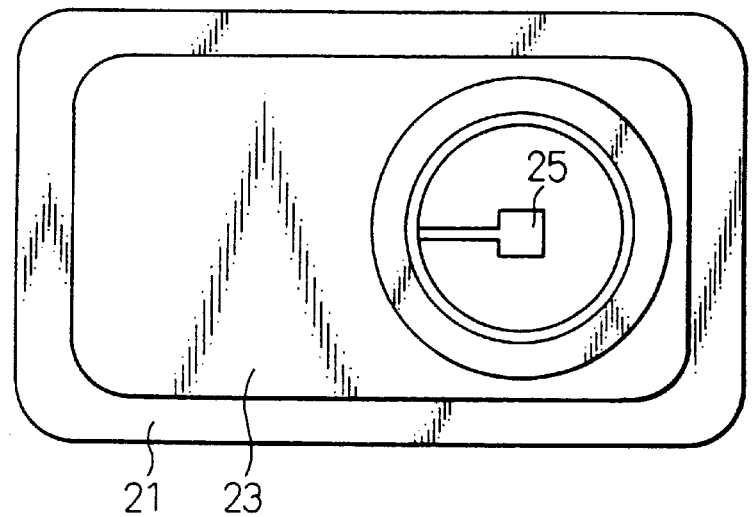
FIGS. 24A and 24B are diagrams showing the structure of a module of the sixth embodiment of the present invention.
Figure 24B:
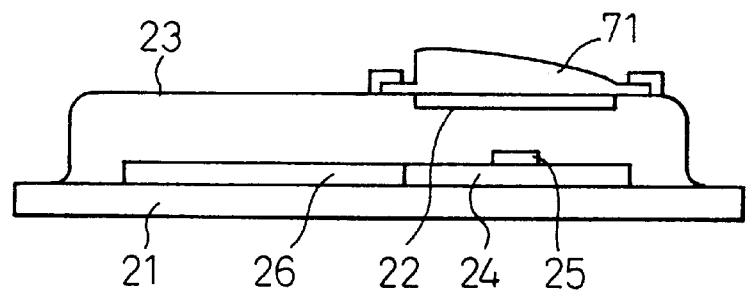

Moreover, by utilizing directivity, only a specific pair of a transmission module and reception module can be allowed to communicate with each other. FIGS. 24A and 24B are diagrams showing the structure of a semiconductor module of the sixth embodiment designed for selective communication between a specific pair of modules. The module utilizes the structure shown in FIG. 11 exhibiting directivity in a direction in which radio waves are radiated and radio waves are received and which is slant to a direction perpendicular to the surface of an antenna element. A lens 71 employed in the structure is made rotatable. The direction in which the module exhibits directivity can be changed by rotating the lens 71. Once a specific transmission module and reception module are adjusted so that they will exhibit strong directivity toward partners, selective communication can be achieved. In FIGS. 24A and 24B, the lens 71 is rotatable. As shown in FIGS. 23A and 23B, it is also possible to make the direction, in which directivity is exhibited, changeable in units of 90°.

Figure 25:
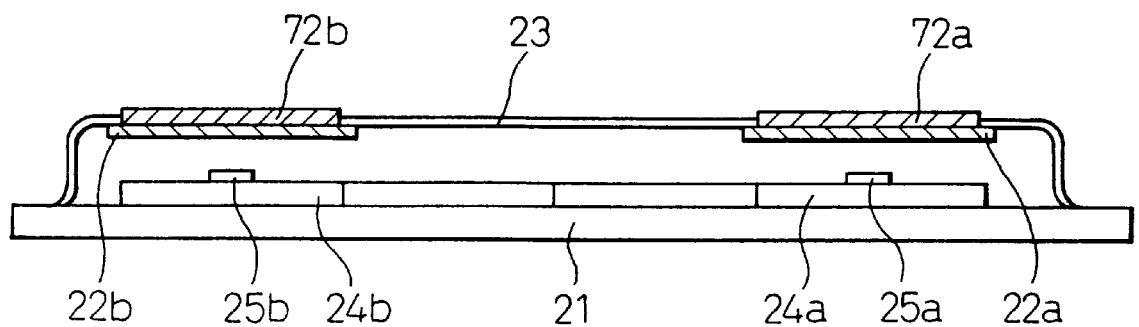
FIG. 25 is a diagram showing the structure of a module of the seventh embodiment of the present invention.

FIG. 25 is a diagram showing the structure of a semiconductor module of the seventh embodiment. The module of the seventh embodiment has two antenna elements 25a and 25b and two electromagnetic-wave radiation windows 22a and 22b. The module is therefore large in size. However, for example, one pair of an antenna element and electromagnetic-wave radiation window may be used exclusively for transmission, and the other pair thereof may be used exclusively for reception. A transmission/reception module may thus be constructed. Any of the aforesaid structures can be adapted to the electromagnetic-wave radiation windows 22a and 22b, so that the windows can be designed to have mutually independent desired characteristics including directivity. In particular, when the polarizer 65 shown in FIGS. 20A to 20C or the lens, which is shown in FIGS. 24A and 24B, having directivity is used as devices 72a and 72b overlying the electromagnetic-wave radiation windows 22a and 22b, the two antenna elements 25a and 25b can be used selectively for transmission and reception to or from specific objects.

Figure 26:
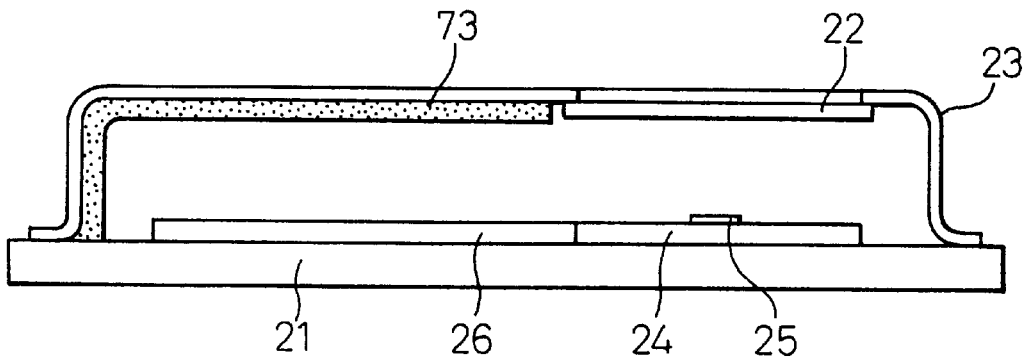
FIG. 26 is a diagram showing the structure of a module of the eighth embodiment of the present invention.

FIG. 26 is a diagram showing the structure of a semiconductor module of the eighth embodiment. In the module of the eighth embodiment, a radio-wave absorbent 73 is coated over the inner surface of the sealing cover 23 except an area thereof opposed to the antenna element 25. According to the structure of the present invention, since an antenna element and semiconductor circuit are placed on the same substrate, radio waves are radiated not only from the antenna element but also from the semiconductor circuit. A semiconductor module of the present invention is covered with a conducting airtight sealing means except a part of the module serving as an electromagnetic-wave radiation window opposed to an antenna element. Radio waves radiated from the antenna element and semiconductor circuit hit the airtight sealing means. Some of these radio waves are absorbed to cause a current to flow, but others thereof are reflected to hit the antenna element and semiconductor circuit. This results in noise. Once the radio-wave absorbent 73 is coated over the airtight sealing unit except a part serving as an electromagnetic-wave radiation window, reflection of radio waves can be reduced by the radio-wave absorbent. Consequently, noise can be minimized. The electromagnetic-wave absorbent is, for example, made of a resin having a ferrite dispersed therein, and is applied to the inner surface of the airtight sealing unit.

Figure 27:
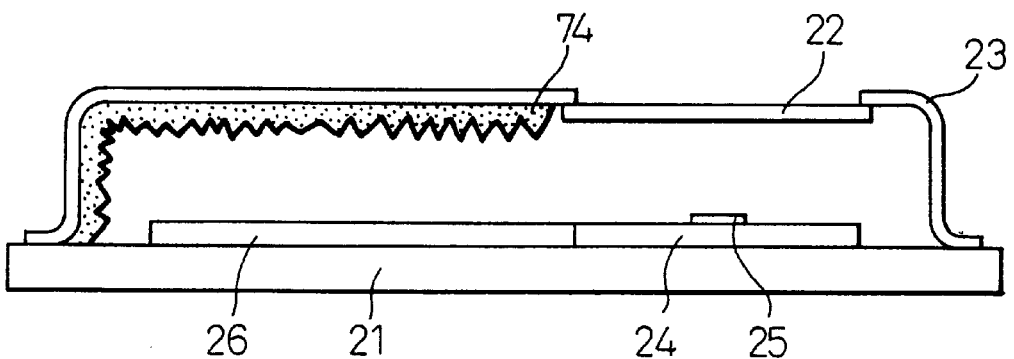
FIG. 27 is a diagram showing a variant of the module of the eighth embodiment.

The surface of the radio-wave absorbent 73 may be, for example, irregular like a radio-wave absorbent 74 shown in FIG. 27. Making the surface of a radio-wave absorbent irregular leads to an increase in area of the surface. The occurrence of resonance or the like can be prevented.

Figure 28:
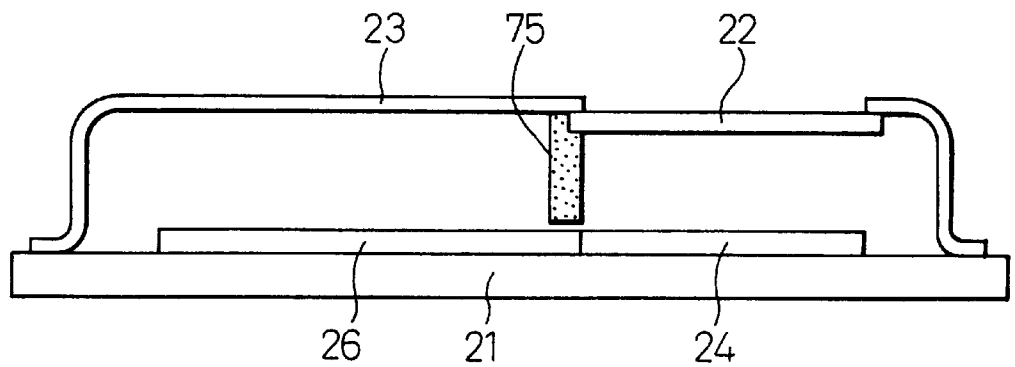
FIG. 28 is a diagram showing the structure of a module of the ninth embodiment of the present invention.

The strength of radio waves output from an antenna element is large. When the radio waves hit a semiconductor circuit, the semiconductor circuit will be adversely affected. A radio-wave absorbent may therefore be, as shown in FIG. 28, placed between a border between an antenna element and semiconductor circuit and an airtight sealing unit, whereby radio waves radiated from the antenna element toward the semiconductor circuit can be minimized greatly.

In the structure shown in FIGS. 3A and 3B, an angle at which radio waves spread is determined by an antenna pattern and limited to an angle at which radio waves propagate from an antenna element to an electromagnetic-wave radiation window. For enlarging the angle at which radio waves to be radiated or received from or to a module, the angle at which radio waves propagate from an antenna element to an electromagnetic-wave radiation window must be enlarged. For enlarging the angle at which radio waves propagate, it is necessary to shorten the distance between the electromagnetic-wave radiation window and the surface of the antenna element, and to shorten the distance between a sealing cover that is an airtight sealing unit to which the electromagnetic-wave radiation window is attached and the surface of the antenna element. As for a semiconductor circuit, there is a problem that when the distance from the sealing cover is shortened, it becomes hard to apply a radio-wave absorbent or the like, and noises caused by radiated radio waves increase accordingly. For solving this problem, the spacing between a part of a substrate on which an antenna element is formed and an electromagnetic-wave radiation window opposed to the part must be made narrower than the spacing between a part thereof on which a semiconductor circuit is formed and an airtight sealing means opposed to the semiconductor-circuit portion.

Figure 29:
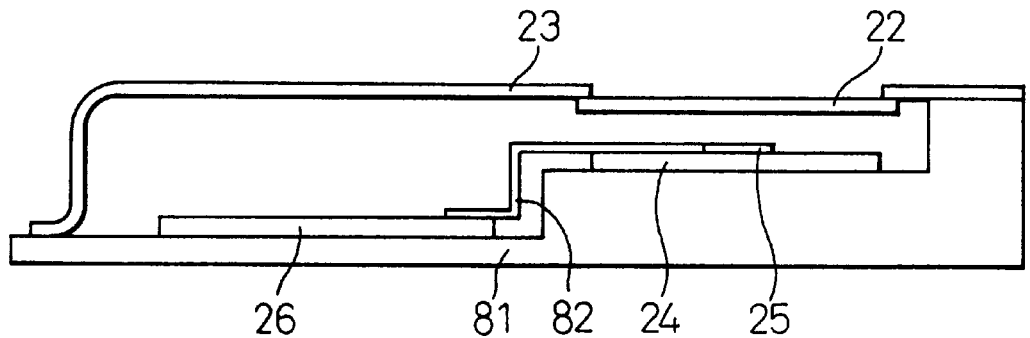
FIG. 29 is a diagram showing the structure of a module of the tenth embodiment of the present invention.

To be more specific, as shown in FIG. 29, the level of the surface of a substrate 81 made of a conducting material such as copper is varied so that the level of a part of the surface on which the dielectric substrate 24 on which the antenna element 25 is formed is mounted will be higher than that of a part thereof on which the GaAs semiconductor substrate 26 on which a semiconductor circuit for handling millimeter waves is formed is mounted. Owing to this structure, even when the top of the sealing cover 23 is flat, and a part of the top thereof opposed to the GaAs semiconductor substrate 26 and the electromagnetic-wave radiation window 22 have the same level, the distance between the antenna element 25 and electromagnetic-wave radiation window 22 becomes shorter, and therefore the angle at which radio waves propagate from the antenna element to the electromagnetic-wave radiation window can be made larger.

Figure 30:
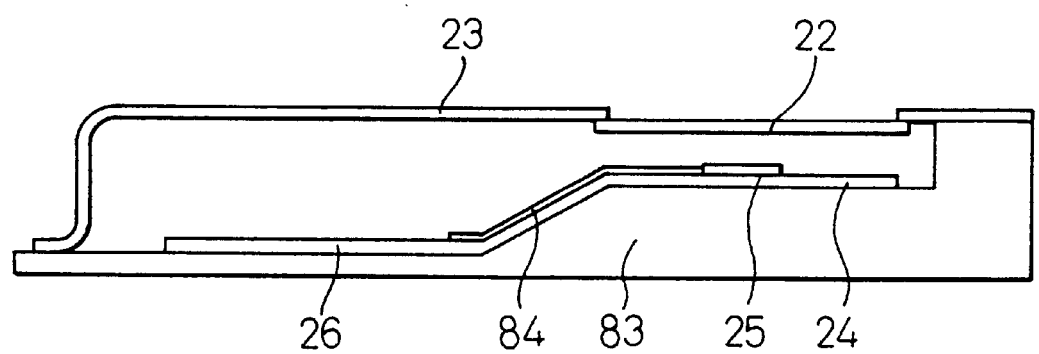
FIG. 30 is a diagram showing a variant of the module of the tenth embodiment.
Figure 31:
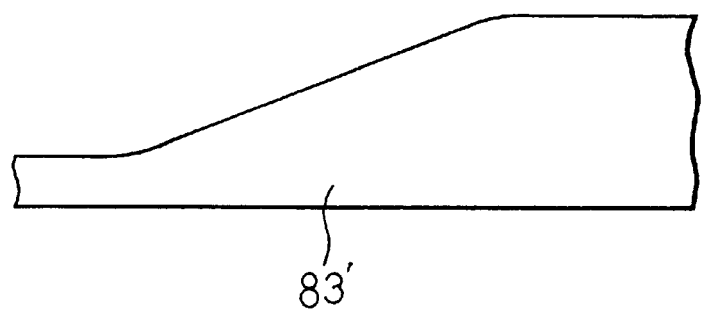
FIG. 31 is a diagram showing a variant of the module of the tenth embodiment.

In FIG. 29, the substrate 81 is stepped at right angles, and a lead 82 is also stepped at right angles. This kind of step is not preferable. As shown in FIG. 30, preferably, the stepped part should be modified to be an inclined plane, and a lead 84 should be routed along the slope. More preferably, the edges of the inclined plane should gradually communicate with adjoining parts.

Figure 32:
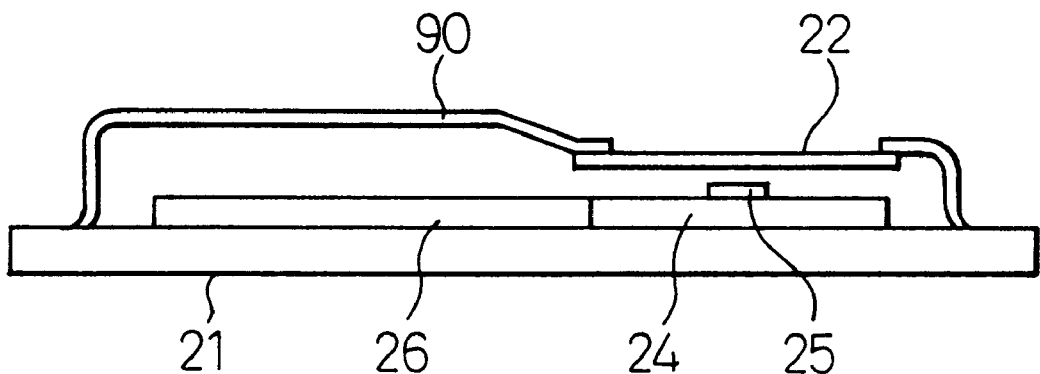
FIG. 32 is a diagram showing the structure of a module of the eleventh embodiment of the present invention.
Figure 33:
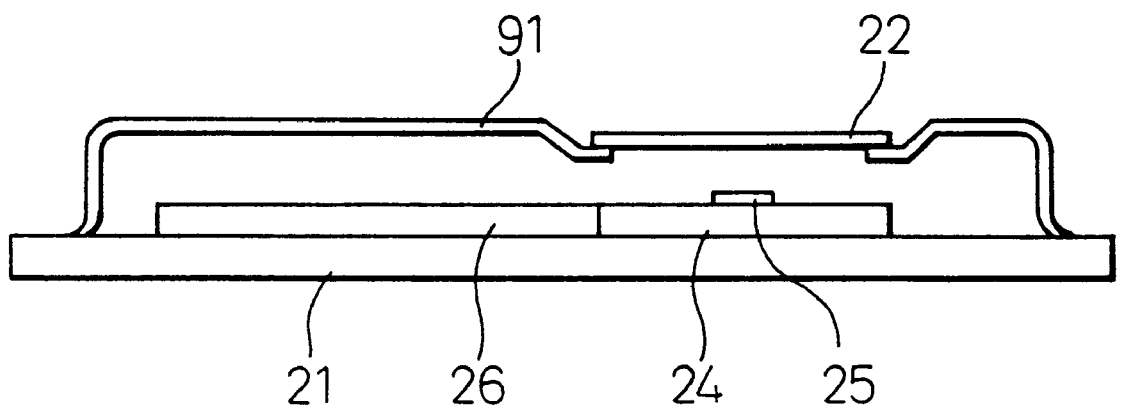
FIG. 33 is a diagram showing a variant of the module of the eleventh embodiment.

Another method of making the spacing between a part of a substrate on which an antenna element is formed and an electromagnetic-wave radiation window opposed to the part narrower than the spacing between a part of the substrate on which a semiconductor circuit is formed and an airtight sealing means opposed to the part is, as shown in FIG. 32, such that the level of a part of a sealing cover 90 to which the electromagnetic-wave radiation window 22 is attached is made lower than that of a part thereof opposed to a semiconductor circuit. In this case, the electromagnetic-wave radiation window 22 may be attached, as shown in FIG. 32, to the lower side of the sealing cover 90, or, as shown in FIG. 33, to the upper side thereof.

As described so far, according to the present invention, for realizing a compact and inexpensive semiconductor module for handling millimeter waves, an antenna element and semiconductor circuit are placed mutually adjacently on a common substrate, and sealed using a conducting sealing cover having an electromagnetic-wave radiation window attached to a part thereof opposed to the antenna element. Directivity for radio waves can be set arbitrarily according to the purpose of use.

Moreover, the antenna element and semiconductor circuit are accommodated together in the module, and the sealing cover is placed adjacently to the antenna element and semiconductor circuit. The problem that radio waves radiated from the antenna element and semiconductor circuit adversely affect mutually to eventually produce noise can be alleviated.

What is claimed is:

1. A semiconductor module, comprising:
   a substrate;
   an antenna element formed on said substrate;
   a semiconductor circuit, formed on the same surface of said substrate as said antenna element so that said semiconductor circuit can be connected to said antenna element, for driving and processing a signal of millimeter waves or quasi millimeter waves;
   a conducting airtight sealing unit mounted on said substrate so that said antenna element and semiconductor circuit can be sealed airtightly; and
   a nonconducting radio-wave radiation window that is a lens attached to an area of said airtight sealing unit opposed to said antenna element.

2. A semiconductor module according to claim 1, wherein said lens is a convergent lens for converging millimeter waves or quasi millimeter waves.

3. A semiconductor module according to claim 1, wherein said lens is a divergent lens for diverging millimeter waves or quasi millimeter waves.

4. A semiconductor module according to claim 1, wherein said lens is a lens whose characteristics are partly different.

5. A semiconductor module according to claim 1, wherein said lens and airtight sealing unit are provided as a cover member that is a unit made of a nonconducting material, and a conducting member is coated over the surface of said cover member except an area of the surface opposed to said antenna element.

6. A semiconductor module according to claim 1, further comprising a reflection reduction plate attached to at lease one surface of said lens, made of a material different from the material of said radio-wave radiation window, and having a thickness thereof set so that surface reflection of millimeter waves or quasi millimeter waves from said lens can be suppressed.

7. A semiconductor module according to claim 1, further comprising a radio-wave absorbent coated over the inner surface of said airtight sealing unit except said lens.

8. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly;

a nonconducting radio-wave radiation window attached to an area of said airtight sealing unit opposed to said antenna element; and a radio-wave absorbent attached to the perimetric part of said radio-wave radiation window adjacent to said airtight sealing unit.

9. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly;

a nonconducting radio-wave radiation window attached to an area of said airtight sealing unit opposed to said antenna element; and a reflection reduction plate attached to at least one surface of said radio-wave radiation window, made of a material different from the material of said radio-wave radiation window, and having a thickness thereof set so that surface reflection of millimeter waves or quasi millimeter waves from said radio-wave radiation window can be suppressed.

10. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly;

a nonconducting radio-wave radiation window attached to an area of said airtight sealing unit opposed to said antenna element; and a convergent lens placed on said radio-wave radiation window, having a center axis thereof deviated from the center of said antenna element, and designed so that the direction of deviation of the center axis thereof from the center of said antenna element can be changed about an axis perpendicular to the surface of said antenna element.

11. A semiconductor module according to claim 10, wherein the direction of deviation of the center axis of said convergent lens can be rotated continuously about an axis perpendicular to the surface of said antenna element.

12. A semiconductor module according to claim 10, wherein the direction of deviation of the center axis of said convergent lens can be changed in units of a given angle about an axis perpendicular to the surface of said antenna element.

13. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly;

a nonconducting radio-wave radiation window attached to an area of said airtight sealing unit opposed to said antenna element; and a sheet polarizer, placed on said radio-wave radiation window, for selectively passing some incident millimeter waves or quasi millimeter waves which are polarized in a given direction.

14. A semiconductor module according to claim 13, wherein said sheet polarizer can be rotated continuously about an axis perpendicular to the surface of said antenna element.

15. A semiconductor module according to claim 13, wherein said sheet polarizer can be set to a rotated state in units of a given angle about an axis perpendicular to the surface of said antenna element.

16. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly; and a nonconducting radio-wave radiation window attached to an area of said airtight sealing unit opposed to said antenna element, wherein said antenna element and radio-wave radiation window include a plurality of pairs of an antenna element and radio-wave radiation window.

17. A semiconductor module according to claim 16, wherein a sheet polarizer for selectively passing some incident millimeter waves or quasi millimeter waves which are polarized in a given direction is placed on each radio-wave radiation window.

18. A semiconductor module according to claim 17, wherein at least some of said plurality of sheet polarizers are mutually different in polarization direction.

19. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly;

a nonconducting radio-wave radiation window attached to an area of said airtight sealing unit opposed to said antenna element; and a radio-wave absorbent coated over the surface of said airtight sealing unit except an area of the surface opposed to said antenna element.

20. A semiconductor module, comprising:

a substrate;

an antenna element formed on said substrate;

a semiconductor circuit, formed on the same surface of said substrate as said antenna element so that said semiconductor circuit can be connected to said antenna element, for driving and processing a signal of millimeter waves or quasi millimeter waves;

a conducting airtight sealing unit mounted on said substrate so that said antenna element and semiconductor circuit can be sealed airtightly; and a nonconducting radio-wave radiation window attached to an area of said airtight sealing unit opposed to said antenna element, wherein the spacing between a part of said substrate on which said antenna element is formed and said electromagnetic-wave radiation window opposed to the part is narrower than the spacing between a part of said substrate on which said semiconductor circuit is formed and said airtight sealing unit opposed to the part.

21. A semiconductor module according to claim 20, wherein the level of the surface of said substrate is different between the part of the surface on which said antenna element is formed and the part thereof on which said semiconductor circuit is formed so that the part of the surface of said substrate on which said antenna element is formed becomes higher than the part thereof on which said semiconductor circuit is formed.

22. A semiconductor module according to claim 20, wherein the level of the surface of said airtight sealing unit is different between a part of the surface opposed to said antenna element and a part thereof opposed to said semiconductor circuit so that the part of the surface of said airtight sealing unit opposed to said antenna element becomes lower than the part thereof opposed to said semiconductor circuit.

* * * * *